United States Patent
Tsui et al.

(10) Patent No.: US 9,299,710 B2
(45) Date of Patent: Mar. 29, 2016

(54) MANUFACTURING METHOD OF CAPACITOR LOWER ELECTRODE AND SEMICONDUCTOR STORAGE DEVICE USING THE SAME

(71) Applicant: INOTERA MEMORIES, INC., Taoyuan County (TW)

(72) Inventors: Regan Stanley Tsui, Taipei (TW); Tzung-Han Lee, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 0 days.

(21) Appl. No.: 14/251,792

(22) Filed: Apr. 14, 2014

(65) Prior Publication Data
US 2015/0214233 A1    Jul. 30, 2015

(30) Foreign Application Priority Data
Jan. 29, 2014 (TW) .............................. 103103495 A

(51) Int. Cl.
*H01L 27/108* (2006.01)
*H01L 49/02* (2006.01)
*H01L 27/10* (2006.01)
*H01L 27/08* (2006.01)

(52) U.S. Cl.
CPC ........ *H01L 27/10844* (2013.01); *H01L 27/108* (2013.01); *H01L 28/60* (2013.01); *H01L 27/0805* (2013.01); *H01L 27/101* (2013.01); *H01L 27/10814* (2013.01); *H01L 28/40* (2013.01)

(58) Field of Classification Search
CPC . H01L 27/10844; H01L 28/60; H01L 27/108; H01L 27/10814; H01L 27/0805; H01L 27/101
USPC ......... 438/243–248, 259, 270, 386–389, 391, 438/700–702; 257/301–309, E27.092, 257/E27.093, E29.346, E21.396, 257/E21.51–E21.545
See application file for complete search history.

(56) References Cited

U.S. PATENT DOCUMENTS

| | | |
|---|---|---|
| 6,351,005 B1 * | 2/2002 | Al-Shareef et al. ........... 257/306 |
| 2002/0022317 A1 * | 2/2002 | Fukuzumi ..................... 438/253 |
| 2013/0264621 A1 * | 10/2013 | Nishi et al. .................... 257/296 |

* cited by examiner

*Primary Examiner* — Yasser A Abdelaziez
*Assistant Examiner* — Farun Lu
(74) *Attorney, Agent, or Firm* — Rosenberg, Klein & Lee

(57) ABSTRACT

A manufacturing method of capacitor lower electrode of the instant disclosure comprises the steps of: providing a semiconductor substrate; forming a sacrificial laminate on the semiconductor substrate; forming a plurality of capacitor trenches in the sacrificial laminate; forming a plurality of lower electrode structures in the capacitor trenches respectively; etching back the sacrificial laminate to a desired thickness to expose an upper portion of each of the lower electrode structures; forming a liner layer to conformally cover the sacrificial laminate and the upper portions of the lower electrode structures; patterning the liner layer to form an insulating spacer on the sidewalls of each of the upper portions, wherein two adjacent insulating spacers are configured to have a self-aligned opening positioned therebetween; and performing a wet-etching process to remove the sacrificial laminate through the self-aligned openings.

4 Claims, 8 Drawing Sheets

MANUFACTURING METHOD OF CAPACITOR LOWER ELECTRODE AND SEMICONDUCTOR STORAGE DEVICE USING THE SAME

BACKGROUND OF THE INVENTION

1. Field of the Invention

The instant disclosure relates to a manufacturing method of charge storage device; in particular, to a manufacturing method of capacitor lower electrode and a semiconductor storage device using the same.

2. Description of Related Art

Dynamic random access memory (DRAM) is one kind of widely used integrated circuit element. With the vigorous development of semiconductor industry, the dimension of integrated circuit elements nowadays range from micron size to submicron size. For DRAM, that is to say, the cross-sectional area of each capacitor and each gap between capacitors become smaller. Basically, the better operating capability of computer software becomes, the greater memory capacitance of computer hardware need. Facing up to the problem of the capacitor dimension become smaller, but the memory capacitance must be increased. The traditional method of manufacturing DRAM capacitors certainly needs to be improved.

Generally, the following methods are often used to increase capacitance to store the bits of data. The first method is to decrease the dielectric constant of the dielectric material. The second method is to decrease the thickness of the dielectric layer. The third method is to increase the electrode contact-surface area. However, in view of the resolution of pattern transfer is increased and the critical dimension of the line width is reduced. Limitation exists for improving lithography by only optical improvement.

In addition, MIM (Metal insulator Metal) capacitors basically a parasitic capacitor between the metal layers. Generally three or more reticles are used in the processing steps. In order to overcome its complex process, the design of DRAM will focus on a reduction in the number of reticles used.

SUMMARY OF THE INVENTION

The object of the instant disclosure is to provide a manufacturing method of capacitor lower electrode. The manufacturing method comprising easy steps of forming openings can help to increase the yield rate of the DRAM device and miniaturize the DRAM device.

In order to achieve the aforementioned objects, according to an embodiment of the instant disclosure, a manufacturing method of capacitor lower electrode comprises the following steps: providing a semiconductor substrate; forming a sacrificial laminate on the semiconductor substrate; forming a plurality of capacitor trenches in the sacrificial laminate; forming a plurality of lower electrode structures in the capacitor trenches respectively; etching back the sacrificial laminate to a desired thickness to expose an upper portion of each of the lower electrode structures; forming a liner layer to conformally cover the sacrificial laminate and the upper portions of the lower electrode structures; patterning the liner layer to form an insulating spacer on the sidewalls of each of the upper portions, wherein two adjacent insulating spacers are configured to have a self-aligned opening positioned therebetween; and performing a wet-etching process to remove the sacrificial laminate through the self-aligned openings.

Accordingly, a semiconductor storage device includes a semiconductor substrate, a sacrificial laminate, a plurality of lower electrode structures, and a plurality of insulating spacers. The sacrificial laminate is arranged on the semiconductor substrate, having a plurality of capacitor trenches formed therein. The lower electrode structures are arranged in the capacitor trenches respectively, where each of the lower electrode structures has an upper portion protruding out of the surface of the semiconductor substrate. The insulating spacers are arranged on the sidewalls of each of the upper portions, wherein two adjacent insulating spacers are configured to have a self-aligned opening positioned therebetween.

In comparison with the traditional method for fabricating capacitors of a semiconductor storage device, the instant method can reduce the reticle requirements as well as form well-defined self-aligned openings by the insulating spacers. Therefore, memory cell capacitors can be integrated much more simply and easily.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
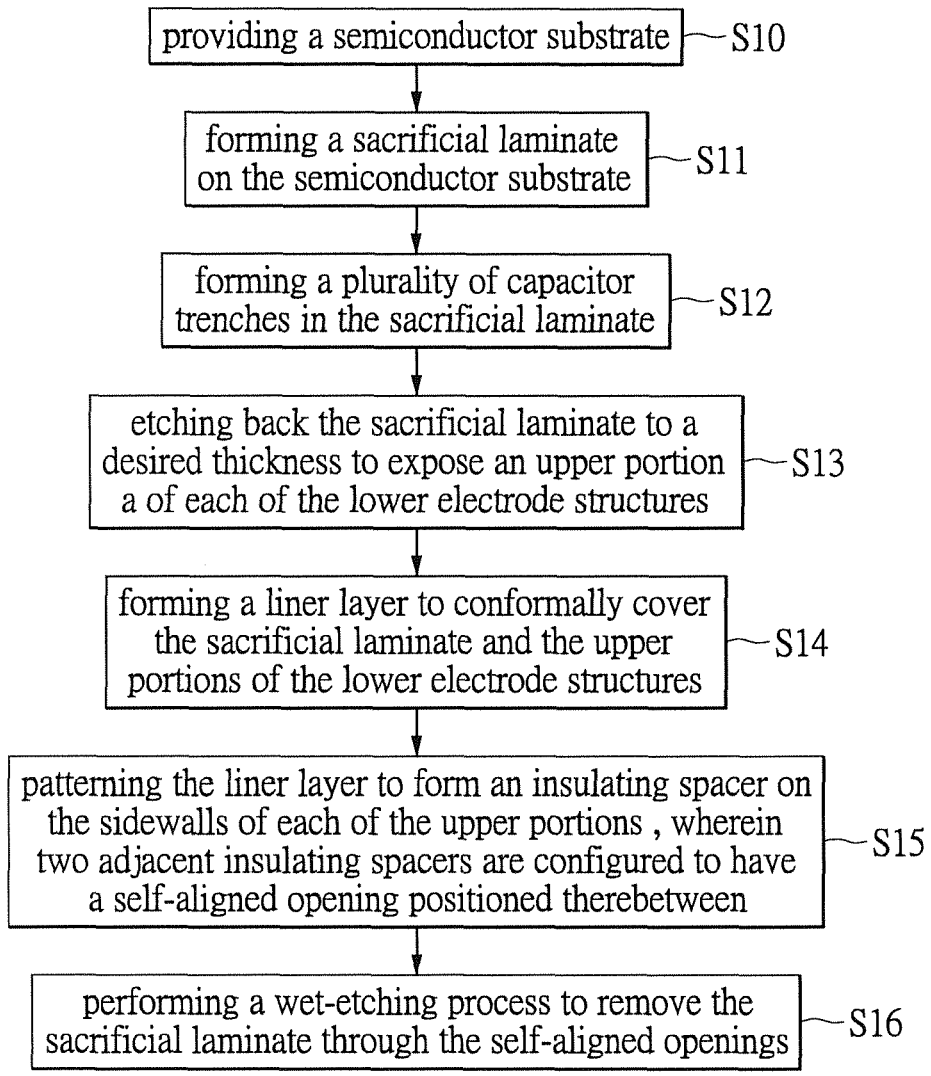
FIG. 1 shows a process flow diagram of a manufacturing method of capacitor lower electrode according to an embodiment of the instant disclosure.
Figure 2:
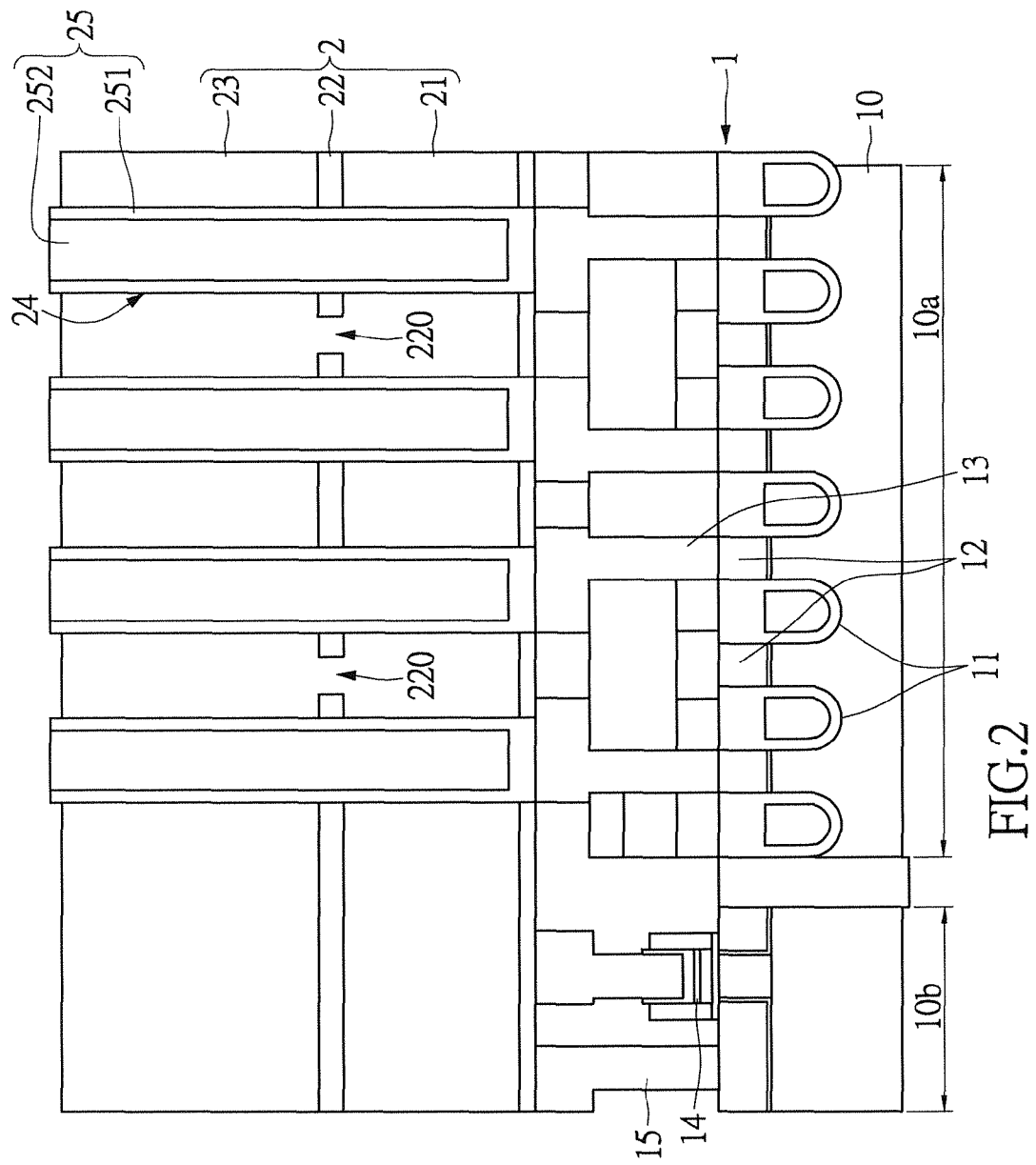
FIGS. 2-6 are cross-sectional diagrams illustrating of the posterior fabrication stage of the manufacturing method of capacitor lower electrode according to an embodiment of the instant disclosure.

Please refer to FIG. 1, which is a process diagram of the manufacturing method of capacitor lower electrode according the present invention. The manufacturing method comprises the following steps:

The first step S10 is to provide a semiconductor substrate 1. As shown in FIG. 2, the semiconductor substrate 1 has an array region 10a defined thereon and at least one peripheral region 10b outside the array region 10a. For one thing, a plurality of buried bit lines 11, a plurality of bit line contacts 12, and a plurality of conductive structures 13 are formed in the array region 10a. A plurality of transistors 14 and a plurality of conductive structures 15 are formed in the peripheral region 10b.

Specifically, the method of providing a semiconductor substrate 1 comprises the following steps. Firstly, a substrate 10 is provided. Then, a plurality of buried bit lines 11 are formed in the substrate 10. Followed on, a plurality of bit line contacts 12 are formed in the substrate 10 at intervals of the buried bit lines 11. After that, a plurality of conductive structures 13 are formed on the bit line contacts 12 respectively, configured to electrically connect subsequently formed lower electrodes (not shown).

The transistors 14 can be, but not limited to, metal oxide semiconductor transistors (MOS transistors). The conductive structures 15 can be served as the conductive plugs for electrically connecting with the source/drain contact regions (not shown). The transistors 14 and the conductive structures 15 in the peripheral region 10b can be formed during or after the processing steps mentioned above.

Referring to FIG. 2, the next step S11 is to form a sacrificial laminate 2 on the semiconductor substrate 1. First, a first oxide layer 21 is formed on the semiconductor substrate 1. Next, a lattice reinforced layer 22 having a plurality of through-holes 220 is formed on the first oxide layer 21. Last, a second oxide layer 23 is formed on the lattice reinforced layer 22. Accordingly, the lattice reinforced layer 22 can not only prevent the subsequently formed lower electrodes from toppling in wet-etching but also a lateral over-etch occurs thereon by an additional etching process.

In practice, the sacrificial laminate 2 can be formed via high density plasma chemical vapor deposition (HDP CVD), plasma-enhanced chemical vapor deposition (PECVD), or any other suitable deposition. The first oxide layer 21 and the second oxide layer 23 can be made of boro-phosphosilicate glass (BPSG) material, phosphosilicate glass (PSG), spin-on glass (SOG), undoped silicate glass (USG), or tetra-ethyl-ortho silicate glass (TEOS). The lattice reinforced layer 22 can be made of silicon nitride (SiN). In another, the first and second oxide layers 21, 23 can be made of any other suitable oxide materials or silicon materials according to the etching solution of the subsequent process.

Referring to FIG. 2 again, the next step S12 is to form a plurality of capacitor trenches 24 in the sacrificial laminate 2, and then form a plurality of lower electrode structures 25 in the capacitor trenches 24 respectively. Specifically, the method of forming the capacitor trenches 24 comprises the following steps. Firstly, a photoresist material is spin-coated on the second oxide layer 23. Then, the photoresist material is exposed and developed through a patterned mask to form a patterned photoresist layer (not shown). Followed on, a process of etching is conducted to form the capacitor trenches 24 that pass through the sacrificial laminate 2 by the patterned photoresist layer as a mask. After that, a process of dry or wet stripping is conducted to remove the patterned photoresist layer.

The method of forming the lower electrode structures 25 comprises the following steps. Firstly, a process of deposition is conducted to conformally form an electrode material such as titanium nitride (TiN) on the sacrificial laminate 2. The exposed surface of the sacrificial laminate 2 and the inner trench wall of each capacitor trench 24 are continually covered by the electrode material. Then, a process of deposition is conducted to form a polysilicon material 252 to fill the capacitor trenches 24. Accordingly, the electrode material within the capacitor trenches 24 can be protected by the polysilicon material 252. Followed on, a process of chemical mechanical polishing (CMP) is conducted to remove the uncovered electrode material. In this way, the lower electrodes 251 are formed, wherein each lower electrode 251 is shaped like, but not limited to, a hollow cylinder.

Figure 3:
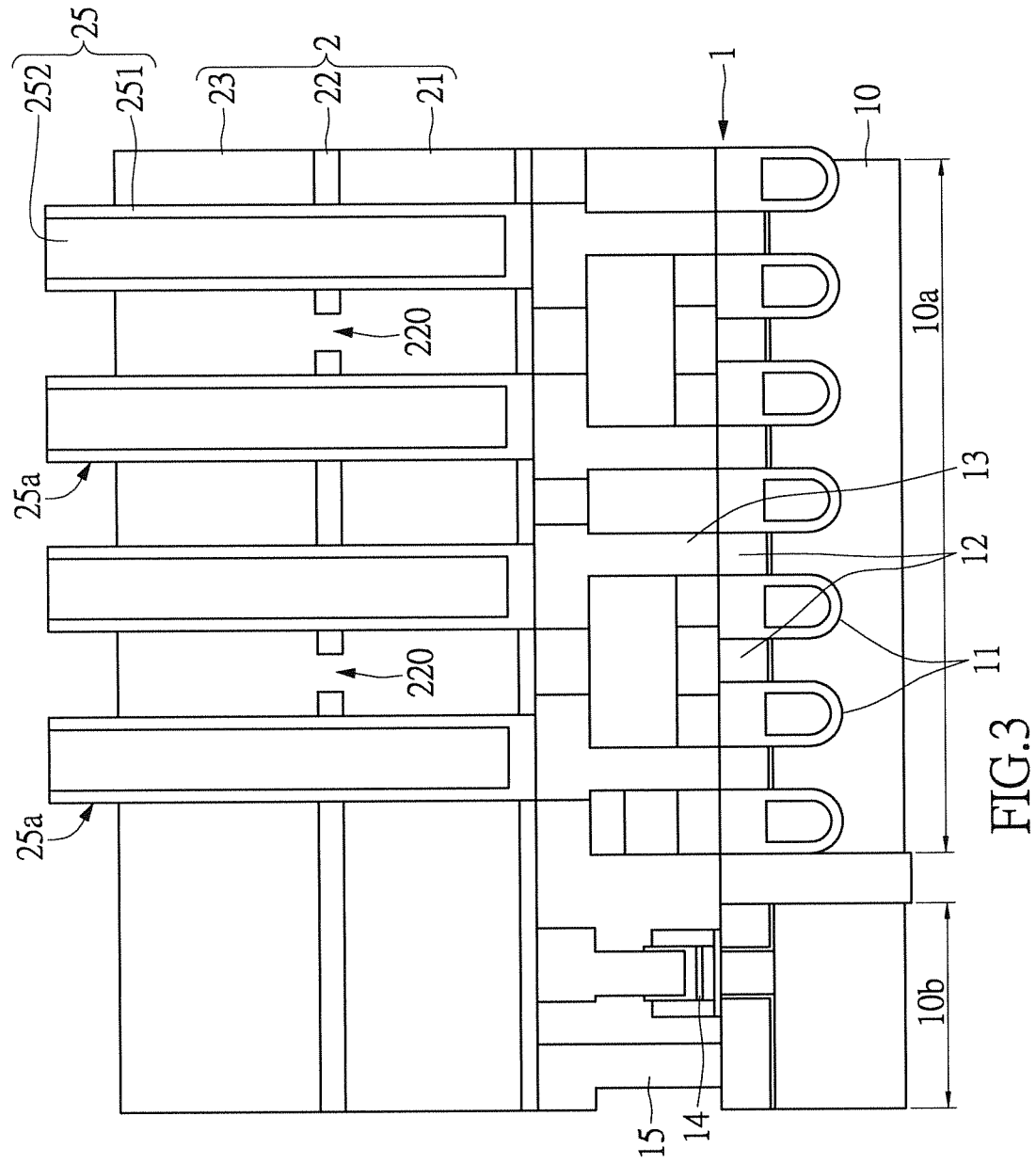

Referring to FIG. 3, the next step S13 is to etch back the sacrificial laminate 2 to a desired thickness to expose an upper portion 25a of each of the lower electrode structures 25. Specifically, the sacrificial laminate 2 is etched by an etching solution exhibiting high selectivity for the second oxide layer 23 with accurate time control of an etch process. When the thickness of the sacrificial laminate 2 is reduced, the height of each of the lower electrode structures 25 relative to the top surface of the sacrificial laminate 2 can be controlled with sufficient accuracy to expose its upper portion 25a. Therefore, the topography of the sacrificial laminate 2 and the lower electrode structures 25 is configured with stepped shape.

Figure 4A:
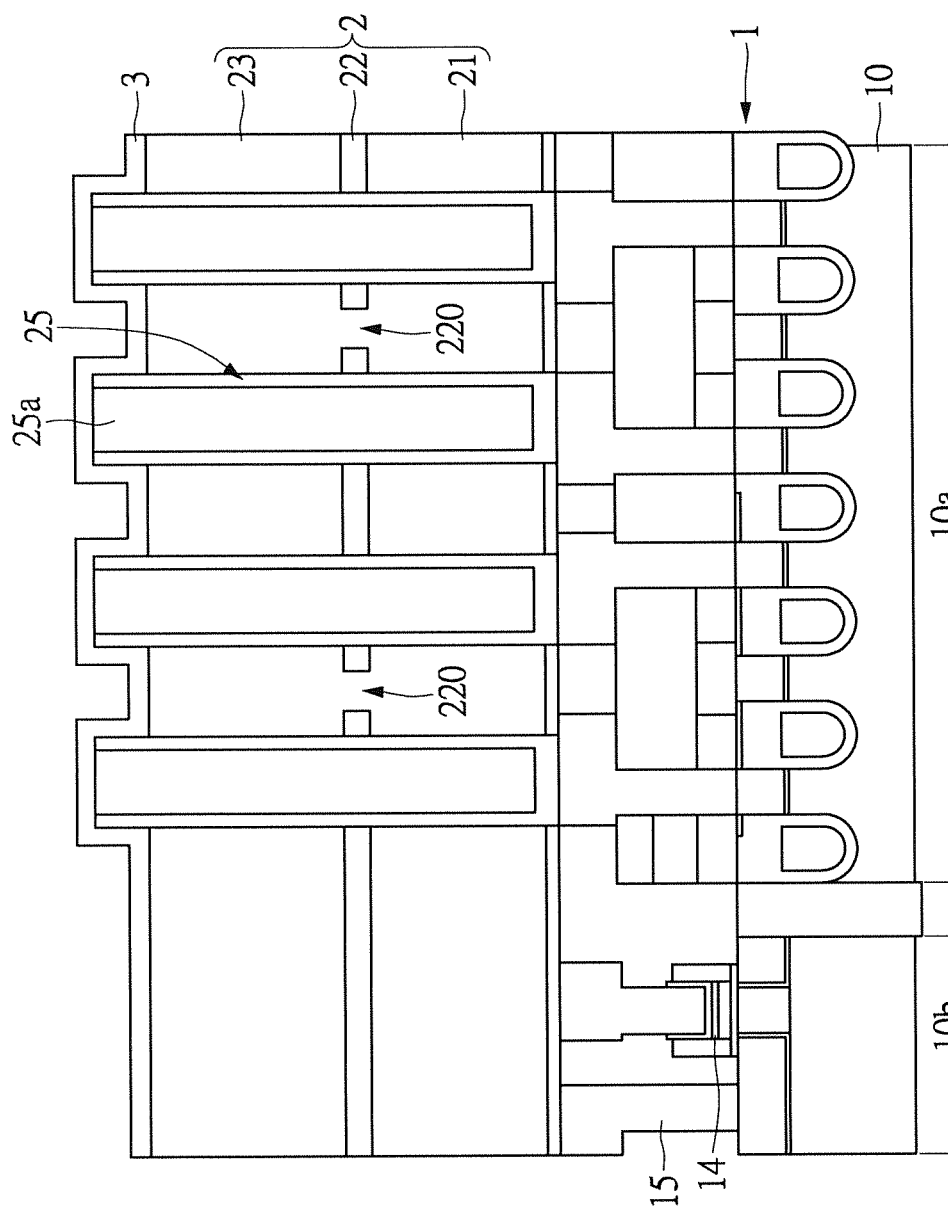

Referring to FIG. 4A, the next step S14 is to form a liner layer 3 to conformally cover the sacrificial laminate 2 and the upper portions 25a of the lower electrode structures 25. In practice, the liner layer 3 can be made of silicon based material such as silicon nitride and be formed along topography via atomic layer deposition (ALD). Accordingly, the thickness of the liner layer 3 can be controlled at sub-micron level, and the uniformity of the liner layer 3 can be improved.

Figure 5A:
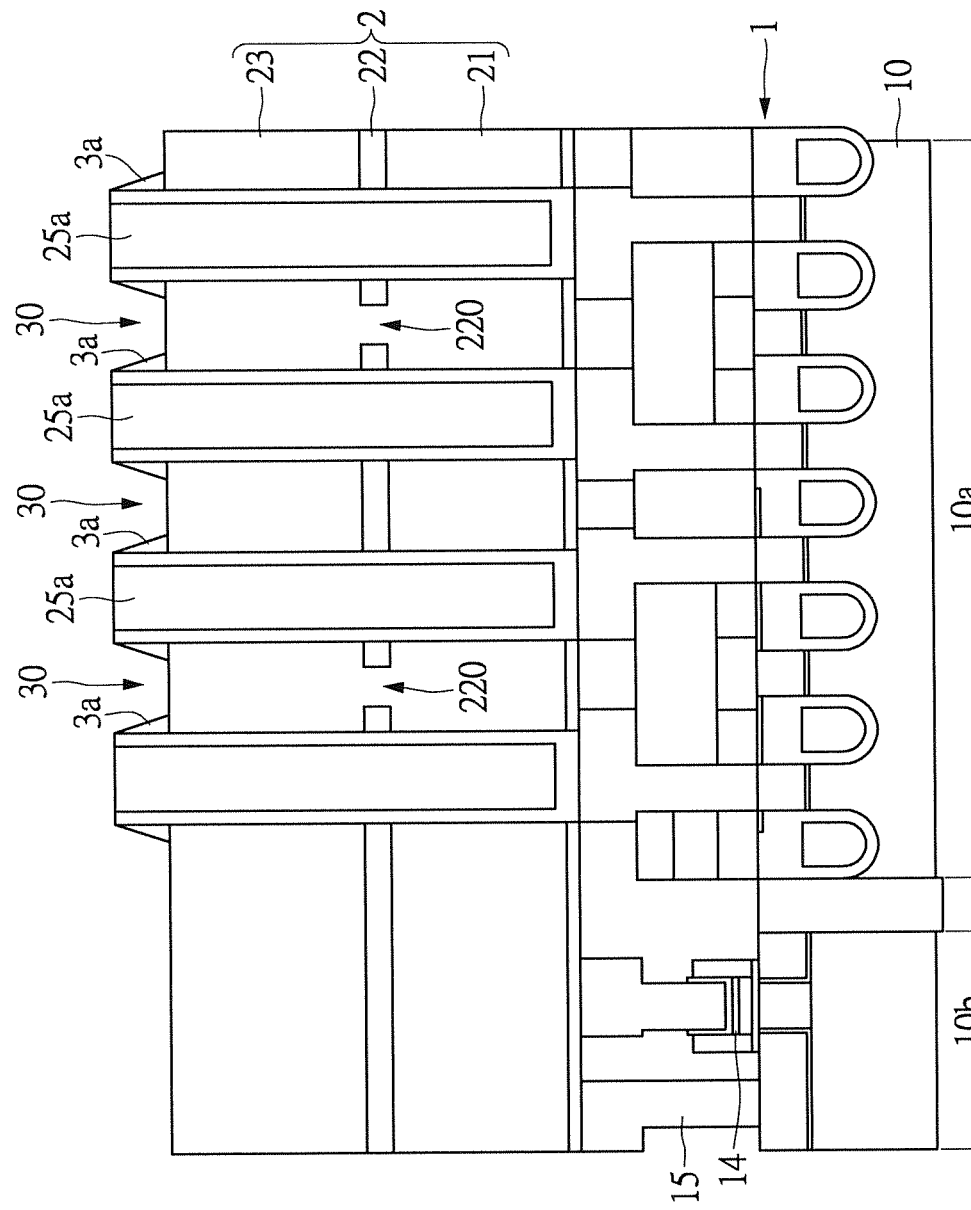

Referring to FIG. 5A, the next step S15 is to pattern the liner layer 3 to form an insulating spacer 3a on the sidewalls of each of the upper portions 25a, wherein two adjacent insulating spacers 3a are configured to have a self-aligned opening 30 positioned therebetween. Specifically, the liner layer 3 is etched via a dry etching process to expose a part of the surface of the second oxide layer 23. In this way, the self-aligned openings 30 can be defined without any reticle such that memory cell capacitors can be integrated much more simply and easily.

Figure 6:
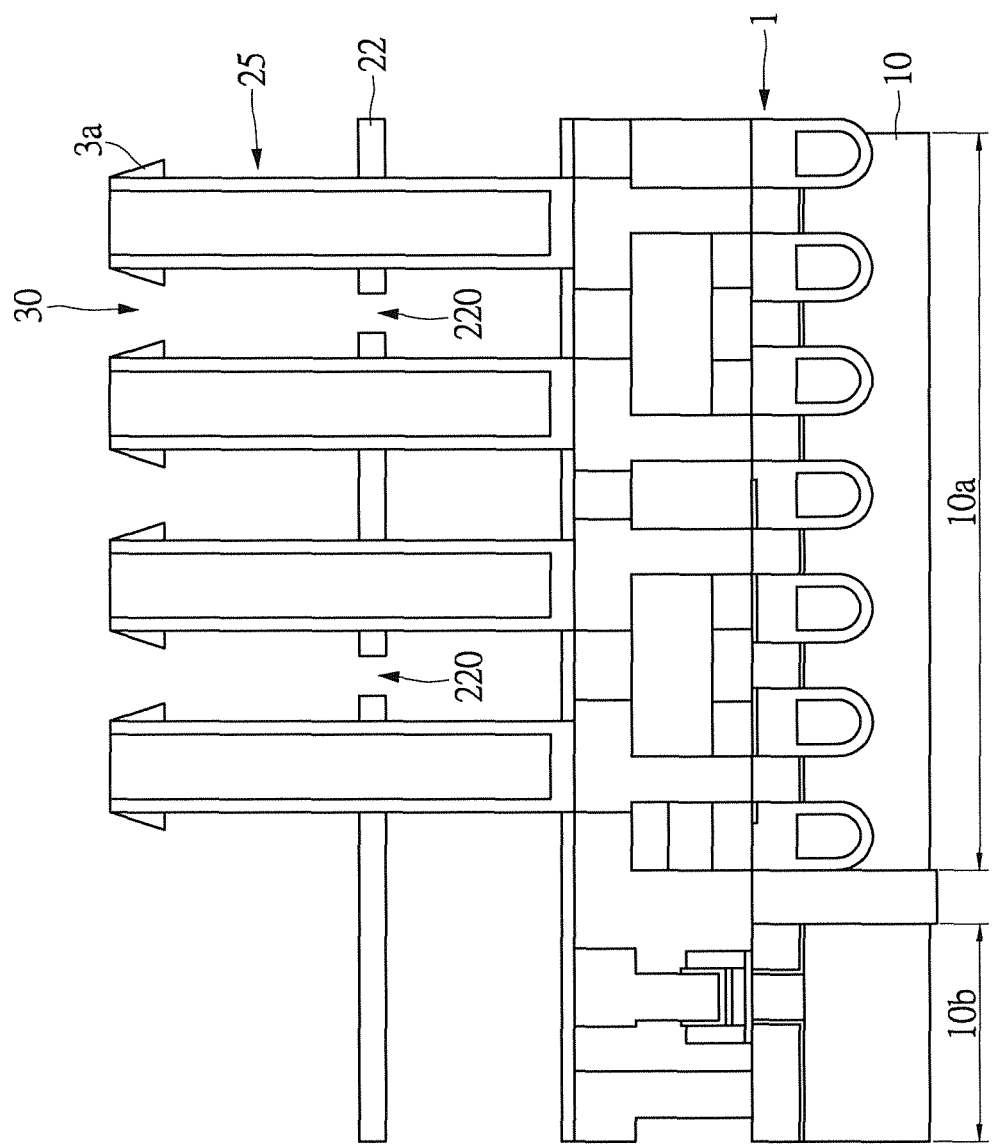

Referring to FIG. 6, the last step S16 is to perform a wet-etching process to remove the sacrificial laminate 2 through the self-aligned openings 30. Specifically, the sacrificial laminate 2 is etched by an etching solution simultaneously exhibiting high selectivity for the first and second oxide layers 21, 23. Although the lattice reinforced layer 22 cannot be removed by the etching solution, the through-holes 220 of the lattice reinforced layer 22 still can allow the etching solution to pass through them to completely remove the first oxide layer 21.

Figure 4B:
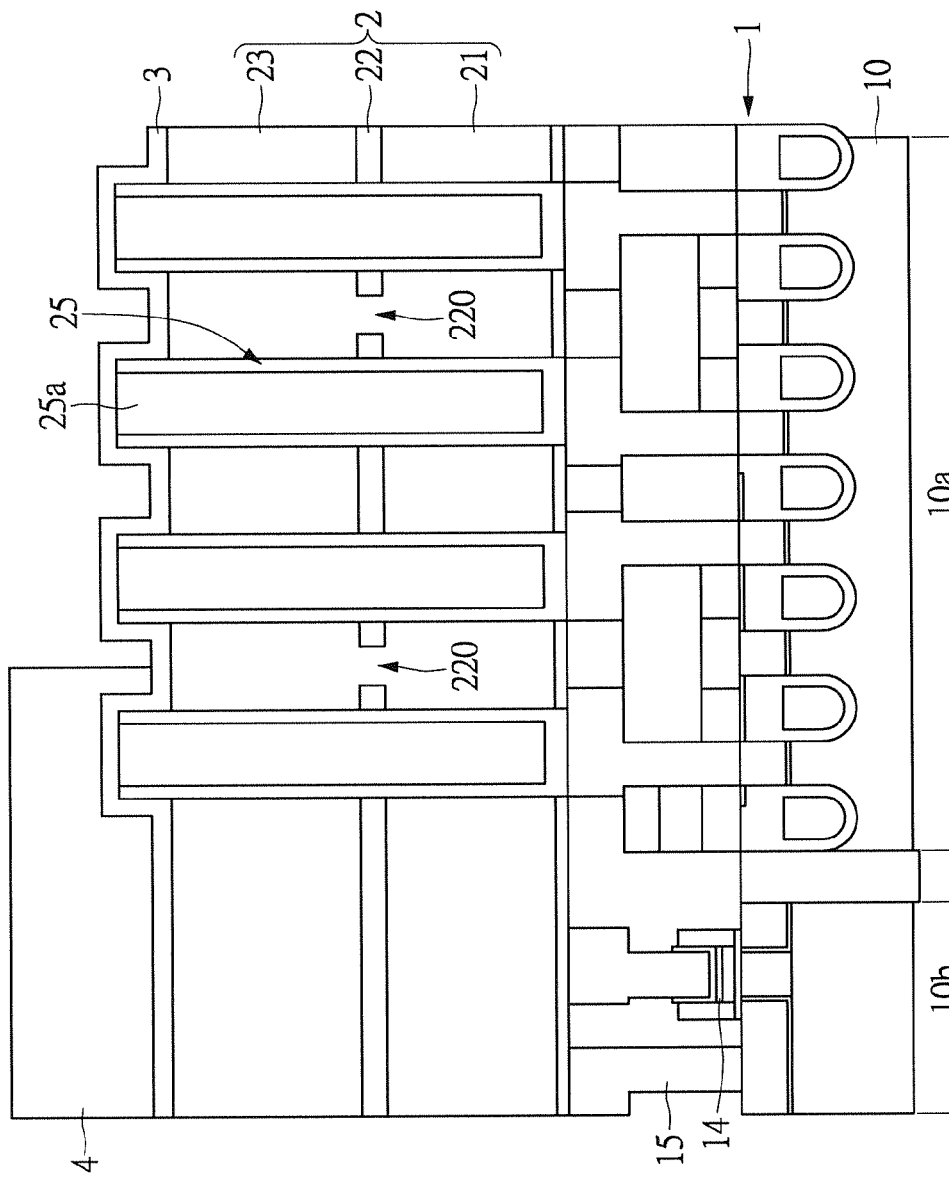
Figure 5B:
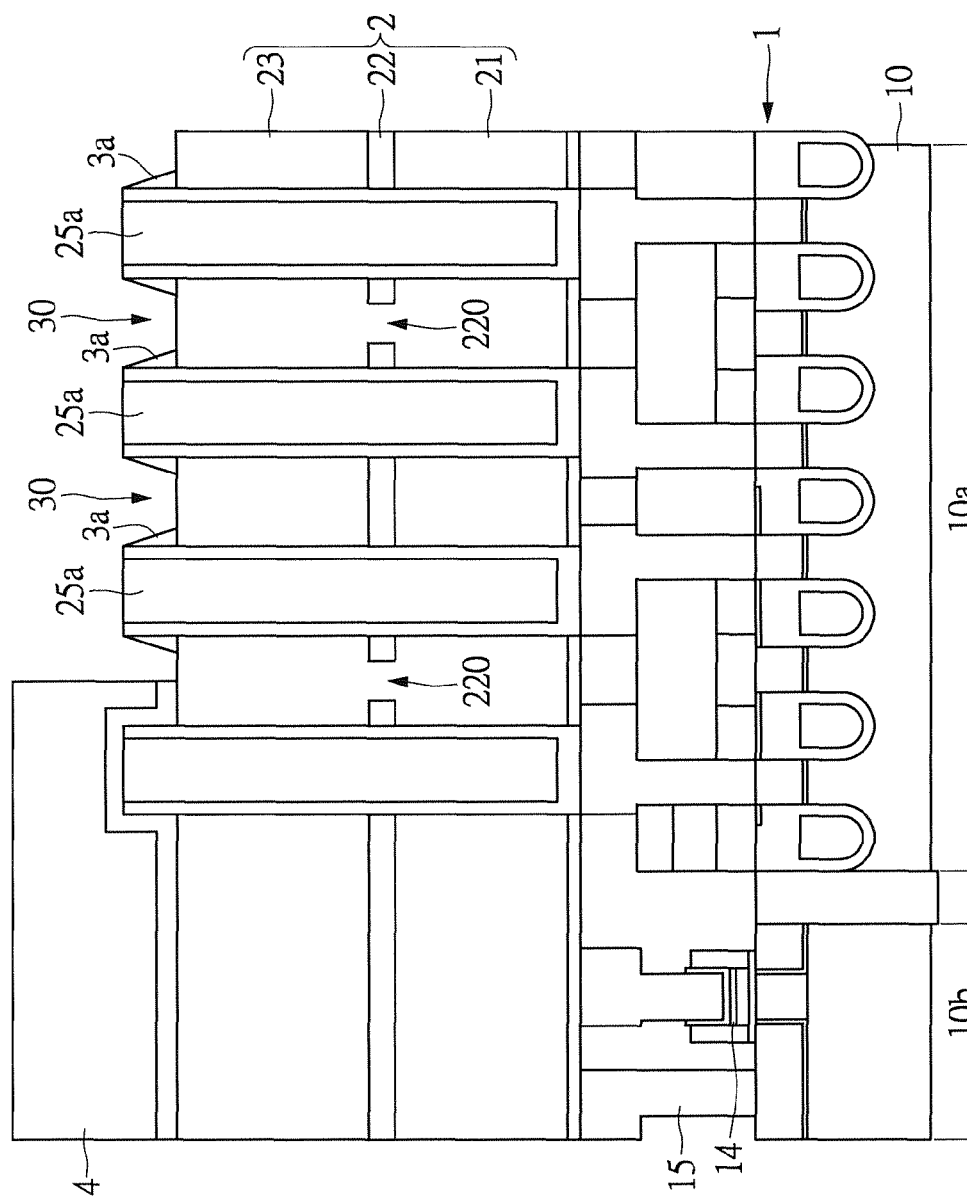

As show in FIGS. 4B and 5B, the manufacturing method further comprises a step of forming a patterned photoresist layer 4 to cover the liner layer 3 within the periphery region 10b between the step S14 and the step S15. Accordingly, the liner layer 3 within the array region 10a can be selectively etched by the patterned photoresist layer 4 as a mask in the step S15.

The semiconductor substrate has a moat structure (not shown) which is configured to isolate the array region 10a and the periphery region 10b. The moat structure and the liner layer 3 within the periphery region 10b are covered by the patterned photoresist layer 4. The first and second oxide layers 21, 23 of the sacrificial laminate 2 with the array region 10a is removed by the patterned photoresist layer 4 as a mask in the step S16.

Please refer to FIGS. 2 and 5A again, the technical features of the manufacturing method of capacitor lower electrode are mentioned above. The instant disclosure further relates to a semiconductor storage device which includes a semiconductor substrate 1, a sacrificial laminate 2, a plurality of lower electrode 25, and a plurality of insulating spacers 3a.

Specifically, the sacrificial laminate 2 is arranged on the semiconductor substrate 1, wherein the semiconductor substrate 1 has a plurality of capacitor trenches 24 formed therein. The lower electrode structures 25 are arranged in the capacitor trenches 24 respectively, where each lower electrode structure 25 has an upper portion 25a protruding out of the surface of the semiconductor substrate 1. The insulating spacers 3 are arranged on the sidewalls of each of the upper portions 25a, wherein two adjacent insulating spacers 3 are configured to have a self-aligned opening 30 positioned therebetween.

The semiconductor substrate 1 includes a substrate 10, a plurality of buried bit lines 11, a plurality of bit line contacts 12, and a plurality of conductive structures 13. The buried bit lines 11 are arranged in the substrate 10. The bit line contacts 12 are arranged in the substrate 10 at intervals of the buried bit lines 11. The conductive structures 13 are arranged on the bit line contacts 12 respectively for electrically connecting to the lower electrode structures 25.

In comparison with the traditional method for fabricating capacitors of a semiconductor storage device, the instant method can reduce the reticle requirements as well as form well-defined self-aligned openings by the insulating spacers. Therefore, memory cell capacitors can be integrated much more simply and easily.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A semiconductor storage device, comprising:
   a semiconductor substrate;
   a sacrificial laminate arranged on the semiconductor substrate, wherein the semiconductor substrate has a plurality of capacitor trenches formed therein, wherein the sacrificial laminate comprises a first oxide layer arranged on the semiconductor substrate, a lattice reinforced layer having a plurality of through-holes arranged on the first oxide layer, and a second oxide layer arranged on the lattice reinforced layer;
   a plurality of lower electrode structures arranged in the capacitor trenches respectively, wherein each electrode structure has an upper portion protruding out of the surface of the sacrificial laminate; and
   a plurality of insulating spacers, each of which is arranged on the sidewalls of each of the upper portions, wherein two adjacent insulating spacers are configured to have a self-aligned opening positioned therebetween.

2. The semiconductor storage device according to claim 1, wherein the semiconductor substrate includes a substrate, a plurality of buried bit lines, a plurality of bit line contacts, and a plurality of conductive structures, the buried bit lines are arranged in the substrate, the bit line contacts are arranged in the substrate at intervals of the buried bit lines, the conductive structures are arranged on the bit line contacts respectively for electrically connecting to the lower electrode structures.

3. The semiconductor storage device according to claim 1, further comprises a liner layer and a photoresist layer, the semiconductor substrate has an array region and a periphery region outside the array region, the lower electrode structures are positioned in the array region, the liner layer conformally covers the sacrificial laminate and the lower electrode structures, the photoresist layer covers the liner layer within the periphery region.

4. The semiconductor storage device according to claim 1, further comprises a liner layer and a photoresist layer, the semiconductor substrate has an array region defined thereon and a periphery region outside the array region, the liner layer conformally covers the sacrificial laminate and the lower electrode structures, the photoresist layer covers the liner layer within the periphery region.

\* \* \* \* \*